United States Patent
Toyoda et al.

(10) Patent No.: US 6,215,189 B1
(45) Date of Patent: Apr. 10, 2001

(54) SEMICONDUCTOR DEVICE HAVING INTERCONNECT LAYER AND METHOD OF MANUFACTURING THEREFOR

(75) Inventors: Yoshihiko Toyoda; Tetsuo Fukada; Takeshi Mori; Yoshiyuki Kitazawa, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/302,290

(22) Filed: Apr. 30, 1999

(30) Foreign Application Priority Data

May 7, 1998 (JP) .................................................. 10-124782

(51) Int. Cl.$^7$ .......................... H01L 23/48; H01L 23/52; H01L 29/40
(52) U.S. Cl. .......................... 257/773; 257/774; 257/750; 257/758
(58) Field of Search .................................. 257/773, 774, 257/750, 751, 758, 762–765; 438/618, 666, 629, 637, 639, 640, 667, 668, 672, 675, 700, 701, 713, 978, 638

(56) References Cited

U.S. PATENT DOCUMENTS

| | | | |
|---|---|---|---|
| 5,783,485 | * 7/1998 | Ong et al. ........................... | 438/637 |
| 5,817,572 | * 10/1998 | Chiang et al. ....................... | 438/624 |
| 6,008,117 | * 12/1999 | Hong et al. ......................... | 438/637 |
| 6,017,817 | * 1/2000 | Chung et al. ........................ | 438/637 |
| 6,037,664 | * 3/2000 | Zhao et al. .......................... | 257/758 |
| 6,040,243 | * 3/2000 | Li et al. .............................. | 438/687 |

FOREIGN PATENT DOCUMENTS 9-172067   6/1997   (JP) .

OTHER PUBLICATIONS

"Copper Integration in Self Aligned dual Damascene Architecture", by Morand et al., 1997 Symposium on VLSI Technology; Digest of Technical Papers, pp. 31–32.
"Copper Barrier, Seed Layer and Planarization Technologies", by Ding et al., 1997 VMIC Conference, Jun. 10–12, 1997, pp. 87–92.

* cited by examiner

Primary Examiner—Eddie C. Lee
Assistant Examiner—Jhihan B. Clark
(74) Attorney, Agent, or Firm—McDermott, Will & Emery

(57) ABSTRACT

A highly reliable semiconductor device having a contact hole with a sufficient area can be obtained. An interlevel insulating film is formed on a conductive region having a first width. A through hole which exposes the conductive region is formed at the interlevel insulating film. A coating film is formed on the interlevel insulating film. In the coating film, an opening having a second width larger than the first width is formed in a region located on the through hole. An interconnect line is formed in a region located on the opening. A conductor film for electrically connecting the conductive region and the interconnect line is generated within the through hole.

16 Claims, 14 Drawing Sheets

SEMICONDUCTOR DEVICE HAVING INTERCONNECT LAYER AND METHOD OF MANUFACTURING THEREFOR

BACKGROUND OF THE INVENTION

1. Field of the Invention

The present invention relates to a semiconductor device and a method of manufacturing thereof, particularly to a semiconductor device having a multilevel interconnect structure with a connecting portion and a method of manufacturing thereof

2. Description of the Background Art

As a semiconductor device such as the LSI is highly integrated, requirements become severer such as enhancement in dimension accuracy of interconnect lines employed in the semiconductor device, assurance of planarity in a multilevel interconnect structure, and process simplification for reduction of the process cost. A proposed approach which has been attracting attention recently is a buried interconnect process (hereinafter referred to as damascene method), as an idea totally opposed to the conventional interconnect formation method according to which an interconnect line is first processed, an interlevel insulating film is then deposited, and thereafter a planarization process is performed. According to the damascene method, a trench is first generated in an insulating film for producing an interconnect line. The trench is filled with metal such as copper as an interconnect line, and a metal film formed in any region except for the trench is removed by chemical-mechanical polishing (hereinafter referred to as CMP) or like method.

Using the damascene method, the high aspect ratio process of aluminum and the high aspect ratio fill-in process of an insulating film that were conventionally required in the interconnect formation process are unnecessary. An advantage accordingly obtained is that the interlevel insulating film can easily be planarized in the multilevel interconnect structure.

"1997 Symposium on VLSI Technology Digest of Technical Papers" pp. 31–32 discloses a dual damascene method. According to the dual damascene method, a trench for generating an interconnect line as described above and a connection hole for connection with another interconnect layer are generated in one etching process. The trench and the connection hole are then filled with a conductor film such as metal in one film-generation process. A conductor film formed in a region other than the trench is removed by the CMP or the like. The dual damascene method provides the reduced number of manufacturing steps of a semiconductor device.

Referring first to FIGS. 21–25, a method of manufacturing a conventional semiconductor device having an interconnect structure generated by the dual damascene method is briefly described based on the document referred to above.

As shown in FIG. 21, a trench for an interconnect line is formed in an oxide film 101 deposited on a semiconductor substrate (not shown), and the trench is filled with metal such as copper to generate a lower-level interconnect line 102 having a width W1. On the first interlevel insulating film 101 and lower-level interconnect line 102, a second interlevel insulating film 103 formed of a silicon oxide film is formed. The film thickness of the second interlevel insulating film 103 is approximately 0.8 μm. An etching stopper layer 104 formed of a silicon nitride film is formed on the second interlevel insulating film 103. An opening 108 for generating a through hole 109 (see FIG. 23) described below is formed in etching stopper layer 104. The film thickness of etching stopper layer 104 is approximately 0.2 μm. A width W2 of opening 108 is made equivalent to the width W1 of lower-level interconnect line 102.

As shown in FIG. 22, a third interlevel insulating film 105 formed of a silicon oxide film is deposited on etching stopper layer 104. The film thickness of the third interlevel insulating film 105 is approximately 0.9 μm.

A resist pattern (not shown) is next formed on the third interlevel insulating film 105. Using the resist pattern as a mask, the third interlevel insulating film 105 is partially removed by anisotropic etching to generate trenches 106a–106d to be filled with second interconnect lines as shown in FIG. 23. The etching for generating trenches 106b–106d is stopped at etching stopper layer 104. However, in the region below trench 106a, etching still proceeds to partially remove the second interlevel insulating film 103 due to the presence of opening 108 in etching stopper layer 104. Accordingly, through hole 109 is formed in the second interlevel insulating film 103. At the bottom of through hole 109, an upper surface of lower-level interconnect line 102 is exposed. In the etching process for generating trenches 106a–106d to be filled with interconnect lines 107a–107d (see FIG. 25), through hole 109 can subsequently be generated. The resist pattern is thereafter removed.

Within trenches 106a–106d and through hole 109, a Ti film and a TiN film (not shown) are formed. As shown in FIG. 24, a metal film 107 such as copper is deposited in trenches 106a–106d and through hole 109 and on the third interlevel insulating films 105a–105c.

Metal film 107 located on the third interlevel insulating films 105a–105c is thereafter removed by the CMP to generate interconnect lines 107a–107d as shown in FIG. 25.

The semiconductor device is thus manufactured conventionally with an interconnect structure produced by the dual damascene method.

Referring to FIG. 21, according to the conventional dual damascene method illustrated in FIGS. 21–25, the width W2 of opening 108 formed in etching stopper layer 104 is defined to be equivalent to or smaller than the width W1 of lower-level interconnect line 102 or the width of interconnect line 107a (see FIG. 25). In some cases, if opening 108 formed in etching stopper layer 104 is displaced horizontally relative to lower-level interconnect line 102 or interconnect line 107a, the plane area of through hole 109 could be smaller than the area originally designed as shown in FIG. 26. When opening 108 of etching stopper layer 104 is thus displaced relative to lower-level interconnect line 102 or interconnect line 107a, through hole 109 could not reach the upper surface of lower-level interconnect line 102, or the area of the upper surface of lower-level interconnect line 102 exposed at the bottom of through hole 109 could be smaller even if through hole 109 reaches the upper surface of interconnect line 102. A problem then arises is that a proper contact resistance between lower-level interconnect line 102 and interconnect line 107a cannot be obtained.

In the conventional device, when opening 108 formed in etching stopper layer 104 is displaced, the shape of through hole 109 in the plan view is a rectangle as shown in FIG. 26, and depending on the distance of displacement of opening 108, the shape of through hole 109 in the plan view varies. FIG. 26 is a plan view of the semiconductor device shown in FIG. 25 with line 900—900 in FIG. 26 corresponding to the cross section of FIG. 25. In the usual anisotropic etching, control of the etching for generating an opening with a rectangular two-dimensional shape is more difficult than the etching for generating an opening having a circular or square two-dimensional shape. Accordingly, the etching for generating through hole 109 shown in FIG. 23 cannot be controlled precisely to cause problems that through hole 109 does not reach lower-level interconnect line 102 and that damage is given to lower-level interconnect line 102 or other components due to overetching.

Referring to FIG. 27, as the plane area of through hole 109 decreases with miniaturization of the semiconductor device, the rate of change in etch rate increases. FIG. 27 is a graph showing a relation between the plane area of the through hole and the etch rate. When through hole 109 having a plane area smaller than the conventional one is formed, the etch rate changes with variation of the plane area of through hole 109, leading to deterioration of control accuracy of etching. Consequently, through hole 109 is improperly made to cause malfunction of the semiconductor device.

SUMMARY OF THE INVENTION

One object of the present invention is to provide a semiconductor device having a contact hole with a sufficient area and having a higher reliability.

Another object of the invention is to provide a method of manufacturing a semiconductor device having a contact hole with a sufficient area and having a higher reliability.

According to one aspect of the invention, a semiconductor device includes a conductive region, an interlevel insulating film, a coating film, an interconnect layer and a conductor film. The conductive region has a first width. The interlevel insulating film is formed on the conductive region. A through hole for exposing the conductive region is formed in the interlevel insulating film. The coating film is formed on the interlevel insulating film. An opening having a second width larger than the first width is formed in the coating film on the through hole. The interconnect layer is formed in a region located on the opening. The conductor film is formed within the through hole for electrically connecting the conductive region and the interconnect layer.

Since the second width of the opening is made larger than the first width of the conductive region, even if the opening formed in the coating film is displaced in the manufacturing process of the semiconductor device, the coating film is not formed in a region where the through hole should be generated. Although there are problems in an etching process for generating the through hole that the two-dimensional shape of the through hole cannot be formed into a prescribed shape due to the presence of the coating film to reduce the plane area of the through hole or that the through hole cannot be generated, those problems can be avoided by the arrangement above. A through hole having a sufficient plane area can thus be produced. If the plane area of the through hole becomes smaller, a contact resistance could be different from a set value, or when the through hole is not generated, defective connection between interconnect lines occurs to cause malfunction of the semiconductor device. However, such problems can be avoided by the arrangement above. A semiconductor device having a high reliability can thus be obtained.

Since the opening has the second width greater than the first width, the margin of position accuracy in generation of the opening in the coating film can be made larger compared with the conventional device without affecting the plane area and the two-dimensional shape of the through hole. A through hole having a sufficient dimension can easily be formed accordingly. The malfunction of the semiconductor device caused by the contact resistance different from the set value due to the reduced plane area of the through hole, or caused by defective connection between interconnect lines due to the through hole can be prevented. A semiconductor device with a high reliability can thus be achieved.

According to the one aspect described above, the conductive region may be a lower-level interconnect layer in the semiconductor device.

According to the one aspect above, the conductive region may be formed at a main surface of a semiconductor substrate in the semiconductor device.

According to the one aspect described above, the interconnect layer may be buried in an insulating film formed on the coating film, and the upper surface of the insulating film and the upper surface of the interconnect layer may be located on substantially the same plane in the semiconductor device.

In this case, in the manufacturing process of the semiconductor device, when a step of generating in the insulating film a trench filled with the interconnect layer and the step of generating the through hole in the interlevel insulating film are successively done in the same etching process, the coating film can be utilized as an etching stopper layer in the etching step for generating the trench. In the etching step for generating the through hole, the reduced plane area of the through hole due to the presence of the coating film as well as the two-dimensional shape of the through hole which does not match with a prescribed shape can be avoided. Consequently, the manufacturing process can be simplified and a semiconductor device provided with a through hole with a sufficient plane area and having a high reliability can easily be obtained.

According to the one aspect above, the width of the opening extending almost vertically relative to the direction in which the interconnect layer extends may be larger than the width of the interconnect layer.

In this case, since the width of the opening is made larger than the width of the interconnect layer, even if the opening formed in the coating film is displaced, the coating film is never formed in a region where the through hole should be formed in the manufacturing process of the semiconductor device. Therefore, in the etching step for generating the through hole, such a problem as decrease of the plane area of the through hole due to the presence of the coating film which causes the two-dimensional shape of the through hole not to match a prescribed shape or the problem that the through hole is not generated can be avoided. Accordingly, a through hole having a sufficient plane area can be formed. Since formation of the through hole with a sufficient plane area is ensured, malfunction of the semiconductor device can be prevented, the malfunction caused by defective connection between interconnect lines due to the reduced plane area of the through hole leading to the contact resistance which is different from a set value and due to the fact that the through hole is not generated. As a result, a semiconductor device with a high reliability can be obtained.

Since the width of the opening is larger than that of the interconnect layer, the margin of position accuracy of the opening can be increased compared with the conventional device without affecting the plane area and the two-dimensional shape of the through hole when the opening is formed at the coating film. Accordingly, the through hole having a sufficient size can easily be generated. As a result, malfunction of the semiconductor device due to improper opening of the through hole can be avoided to obtain a highly reliable semiconductor device.

According to the one aspect above, the width of the interconnect layer may be larger than the width of the opening in the direction almost perpendicular to the direction in which the interconnect layer extends in the semiconductor device.

In this case, the interconnect layer can be formed to cover the entire opening. In the manufacturing process of the semiconductor device, the coating film can be used as an etching mask for generating the through hole to form the through hole having its two-dimensional shape similar to that of the opening at the coating film. The through hole having the second width greater than the first width can thus be formed. The through hole having a sufficient plane area can easily be formed. A highly reliable semiconductor device can thus be obtained.

According to the one aspect above, the two-dimensional shape of the opening may be almost square in the semiconductor device.

In this case, when the through hole is formed by etching using the coating film as an etching mask, the two-dimensional shape of the through hole can be made almost square. Etching for generating a through hole having its two-dimensional shape which is almost square can be controlled more precisely than the conventional etching which generates a rectangular two-dimensional shape.

Since the two-dimensional shape of the through hole is almost square which is similar to the two-dimensional shape of the opening, the two-dimensional shape of the through hole does not become a rectangle having various sizes as produced due to displacement of the opening in the conventional manufacturing process of a semiconductor device. The etching for generating the through hole can be controlled more easily. The through hole having a sufficient plane area can easily be generated. Malfunction of the semiconductor device due to improper opening of the through hole can be prevented and a semiconductor device having a higher reliability can easily be obtained. As the size of the through hole decreases, the rate of change of etch rate relative to the change of the size of the through hole becomes higher. Therefore, as the size of the through hole becomes extremely smaller, the invention becomes more effective in that the change of the etch rate can be prevented and the etching can be controlled precisely by making the two-dimensional shape of the through hole with a prescribed size.

According to the one aspect above of the invention, the width of the interconnect layer may be almost equal to the width of the opening in the direction almost parallel to the direction in which the interconnect layer extends in the semiconductor device.

In this case, when the coating film is used as an etching mask in the etching step for generating the through hole, the width of the through hole in the direction almost parallel to the direction in which the interconnect layer extends can be made almost equal to the width of the interconnect layer. When the width of the through hole in the direction almost perpendicular to the direction in which the interconnect layer extends is made almost equal to the width of the interconnect layer, the through hole can be shaped into a square in the plan view. In this case, compared with the conventional device in which the through hole is rectangular, the etching for generating the through hole can precisely be controlled.

According to the one aspect above, a barrier metal layer is formed at the surface of the interconnect layer in the semiconductor device.

According to the one aspect above, the barrier metal layer may include at least the one selected from the group consisting of refractory metal, nitride of refractory metal, nitride of refractory metal and silicon, alloy containing at least two kinds of refractory metal, and nitride of alloy containing at least two kinds of refractory metal in the semiconductor device.

In the semiconductor device according to the one aspect above, the interconnect layer and the conductor film may include at least the one selected from the group consisting of Cu, Cu alloy, Al, Al alloy, Ag, Ag alloy, Au, W, WN, TiN, TiWN, Ta, TaN, and doped polysilicon.

In the semiconductor device according to the one aspect above, the coating film may include at least the one selected from the group consisting of SiN, SiON, SiN containing fluorine, SiON containing fluorine, $Al_2O_3$, and $Al_2O_3$ containing fluorine.

According to a manufacturing method of a semiconductor device in another aspect of the invention, a conductive region having a first width is formed. An interlevel insulating film is formed on the conductive region. On the interlevel insulating film, a coating film including an opening having a second width larger than the first width in a region located on the conductive region is formed. In the region located on the conductive region, the interlevel insulating film is removed by etching to generate a through hole that exposes the conductive region. A conductor film is formed within the through hole. An interconnect layer which is electrically connected with the conductive region via the conductor film is formed.

According to this method, the second width of the opening is made larger than the first width of the conductive region so that the coating film is not generated in a region where the through hole should be formed even if the opening formed at the coating film is displaced. Some problems can be prevented accordingly in the etching step for generating the through hole. Those problems are that the two-dimensional shape of the through hole cannot have a prescribed shape, and accordingly the plane area of the through hole becomes smaller or that the through hole cannot be generated due to the presence of the coating film. A through hole having a sufficient plane area can thus be formed surely and easily. Malfunction of the semiconductor device due to improper opening of the through hole can be avoided. Consequently, a highly reliable semiconductor device can readily be obtained.

Further, the opening has the second width larger than the first width, the margin of the position accuracy can be increased when the opening is formed at the coating film without affecting the plane area and the two-dimensional shape of the through hole. A through hole having a sufficient size can easily be formed. Occurrence of malfunction of the semiconductor device due to improper opening of the through hole can easily be prevented. A highly reliable semiconductor device can thus be obtained easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention are hereinafter described in conjunction with the drawings.

First Embodiment

Figure 1:
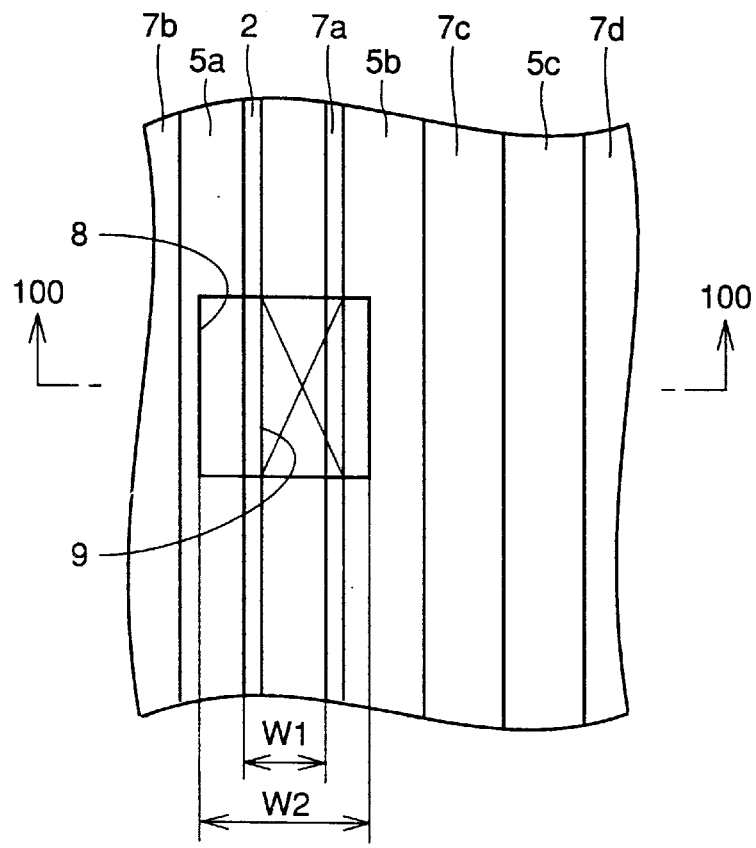
FIG. 1 is a plan view of a semiconductor device according to a first embodiment of the invention.
Figure 2:
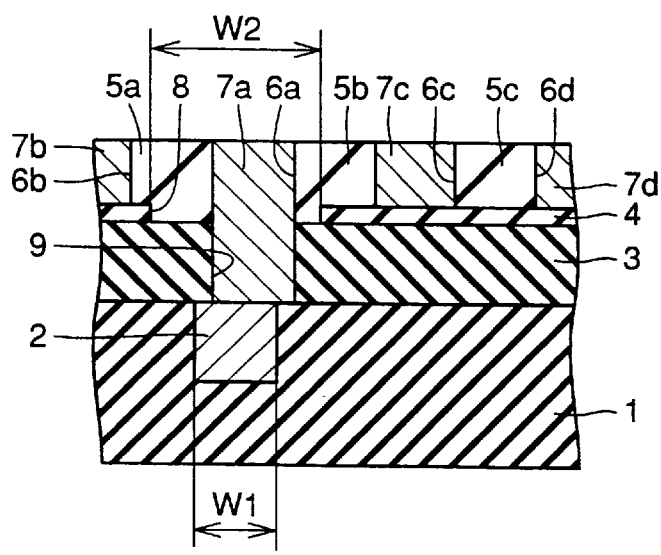
FIG. 2 is a cross section along line 100—100 in FIG. 1.

Referring to FIGS. 1 and 2, a semiconductor device according to the first embodiment of the invention is described.

Referring to FIG. 2, the semiconductor device of the first embodiment includes first to third interlevel insulating films 1, 3 and 5a–5c, a lower-level interconnect line 2, an etching stopper layer 4 and interconnect lines 7a–7d. The first interlevel insulating film 1 is formed on a semiconductor substrate (not shown). Lower-level interconnect line 2 is generated by filling a trench formed for making an interconnect line in the first interlevel insulating film 1 with metal such as copper. The second interlevel insulating film 3 is formed on the first interlevel insulating film 1 and lower-level interconnect line 2. On the second interlevel insulating film 3, etching stopper layer 4 formed of a silicon nitride film is formed. An opening 8 is formed at etching stopper layer 4.

Although the two-dimensional shape of opening 8 is square as shown in FIG. 1, it may be circular. If opening 8 has its two-dimensional shape of a circle, etching for generating opening 8 can be controlled more precisely. The circular two-dimensional shape of opening 8 provides such effects as improved coverage of barrier metal formed in opening 8 and easier fill-in of opening 8 with a metal film.

A width W2 of opening 8 is larger than a width W1 of lower-level interconnect line 2. The third interlevel insulating films 5a–5c are formed on etching stopper layer 4. Interconnect lines 7a–7d are generated by filling, trenches 6a–6d formed in the third interlevel insulating films 5a–5c for making interconnect lines, with metal such as copper. Interconnect line 7a is electrically connected with lower-level interconnect line 2 by a metal film such as copper formed within a through hole 9.

Since the width W2 of opening 8 of etching stopper layer 4 is made larger than the width W1 of lower-level interconnect line 2, the distance between a sidewall of through hole 9 and a sidewall of opening 8 of etching stopper layer 4 can be made large enough. Therefore, even if opening 8 of etching stopper layer 4 is displaced in the manufacturing process of the semiconductor device, etching stopper layer 4 is not formed in a region where through hole 9 is generated. In the etching process for generating through hole 9, if etching stopper layer 4 is present there, the two-dimensional shape of through hole 9 cannot be formed into a prescribed shape and accordingly the plane area of through hole 9 becomes smaller or through hole 9 cannot be generated. According to the invention, such problems can be prevented. Through hole 9 having a sufficient plane area can thus be produced. Malfunction of the semiconductor device due to such an improper through hole that prevents connection between lower-level interconnect layer 2 and interconnect line 7a can be avoided. A highly reliable semiconductor device can thus be obtained.

Further, since opening 8 has the width W2 larger than the width W1 of lower-level interconnect line 2, even if opening 8 of etching stopper layer 4 is displaced to some extent, the distance between through hole 9 and etching stopper layer 4 can be made large enough. Accordingly, when opening 8 is to be formed at etching stopper layer 4 without affecting the plane area and two-dimensional shape of through hole 9, the margin of position accuracy can be increased compared with the conventional device. Through hole 9 having a sufficient size can be formed more easily. Consequently, such a problem as malfunction of the semiconductor device due to improperly generated through hole 9 can be avoided more easily. A highly reliable semiconductor device can thus be obtained.

Further, when the step of generating trenches 6a–6d to be filled with interconnect lines 7a–7d and the step of generating through hole 9 in the second interlevel insulating film 3 are successively performed in the same etching process, etching stopper layer 4 can be utilized as an etching stopper in the etching step for generating trenches 6a–6d. In the etching step for generating through hole 9, reduction of the plane area of through hole 9 and the two-dimensional shape of through hole 9 which is not formed into a prescribed shape due to presence of etching stopper layer 4 can be avoided. Accordingly, the manufacturing process can be simplified and a highly reliable semiconductor device having a through hole with a sufficient plane area can easily be formed.

Referring now to FIGS. 3–6, the steps of manufacturing the semiconductor device according to the first embodiment of the invention are described.

Figure 3:
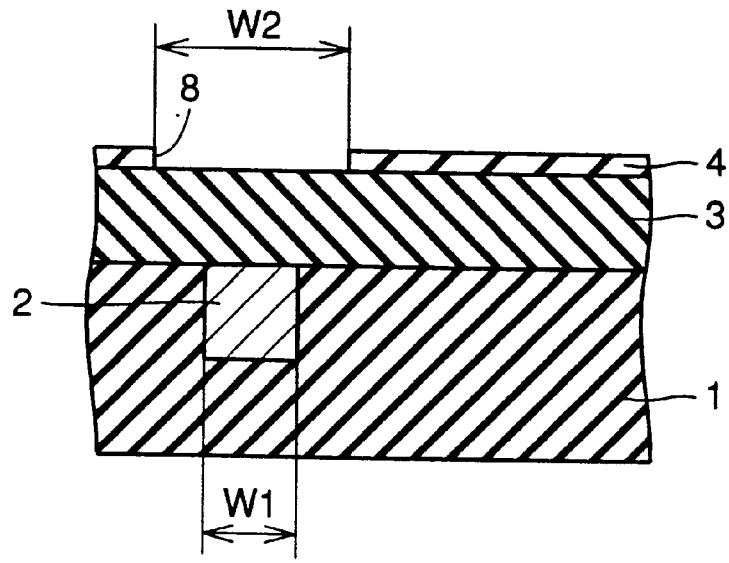
FIGS. 3–6 are cross sections respectively illustrating the first to the fourth steps of a manufacturing process of the semiconductor device in the first embodiment of the invention shown in FIG. 2.

Referring to FIG. 3, a trench having the width W1 is formed at a surface of the first interlevel insulating film 1 formed of a silicon oxide film or the like. Lower-level interconnect line 2 is generated by filling the trench with a conductor formed of doped polysilicon or metal such as copper. The second interlevel insulating film 3 is formed on the first interlevel insulating film 1 and on lower-level interconnect line 2. The second interlevel insulating film 3 has its thickness of approximately 0.5–1.5 μm. A plasma TEOS film and a plasma $SiO_2$ are generally employed as the second interlevel insulating film 3. However, a fluorine added $SiO_2$ film having the relative dielectric constant lower than that of the $SiO_2$, an SOG film and polymer are employed in recent years. When such materials having the low dielectric constant are employed, they are used with the $SiO_2$ film as stacked films. The capacitance between interconnect lines can accordingly be reduced by employing the low-dielectric constant material, and occurrence of RC delay of the interconnect lines can be prevented.

If lower-level interconnect line 2 is formed of such a material as copper where oxidation proceeds inwardly, an anti-oxidation film should be formed on lower-level interconnect line 2. An insulating film such as an SiN film or a metal film is used as the anti-oxidation film.

Etching stopper layer 4 is next formed on the second interlevel insulating film 3. An SiN film formed by plasma CVD is used as etching stopper layer 4. SiON and $Al_2O_3$ may be employed instead of SiN. The relative dielectric constant of the material used for etching stopper layer 4 has a value higher than that of the relative dielectric constant of $SiO_2$. In order to reduce the relative dielectric constant, SiN containing fluorine (F), SiON containing fluorine (F), and $Al_2O_3$ containing fluorine (F) may be used. The capacitance between interconnect lines can be decreased accordingly. The relative dielectric constant of these materials is shown in Table 1.

TABLE 1

Relative Dielectric Constant of Each Material of Etching Stopper Film

| Material | No F Added | F Added |
|---|---|---|
| SiN | 7.5 | 6.5 |
| SiON | 6 | 5.5 |
| $Al_2O_3$ | 9 | 8.5 |

The film thickness of etching stopper layer 4 is determined by selectivity of etching stopper layer 4 relative to the second interlevel insulating film 3 in the etching step for generating trenches 6a–6d (see FIG. 2) and through hole 9 (see FIG. 2) described below. For example, if plasma TEOS and plasma SiN are used respectively as the second interlevel insulating film 3 and etching stopper layer 4, the film thickness of etching stopper layer 4 is about 50–20 nm. Etching conditions in this case are shown in Table 2.

TABLE 2

Etching Condition

| Item | Data |
|---|---|
| Gas Type | $C_4F_8/O_2$ |
| Gas Flow Rate | 20/10 sccm |
| Pressure | 2 mTorr |
| RF Power | 1 KW |
| Substrate Temperature | 0° C. |

The etch rate of various materials used as the interlevel insulating film is shown in Table 3, and the etch rate and the selectivity relative to plasma TEOS of various materials used as etching stopper layer 4 are shown in Table 4.

TABLE 3

Etch Rate of Each Material

| Material | Etch Rate |
|---|---|
| Plasma TEOS | 400 nm/min |
| Plasma $SiO_2$ | 400 nm/min |
| SOG | 500 nm/min |

TABLE 4

Etch Rate and Selectivity of Each Etching Stopper Material

| Etching Stopper Material | Etch Rate | Selectivity (relative to Plasma TEOS) |
|---|---|---|
| Plasma SiN | 30 nm/min | 13.3 |
| Plasma SiON | 50 nm/min | 8 |
| Plasma $Al_2O_3$ | 10 nm/min | 40 |
| F Added Plasma SiN | 35 nm/min | 11 |
| F Added Plasma SiON | 60 nm/min | 6.7 |
| F Added Plasma $Al_2O_3$ | 12 nm/min | 33.3 |

When polymer is used as the second interlevel insulating film 3, it is possible to use plasma TEOS, plasma $SiO_2$, fluorine added $SiO_2$, SOG and the like as etching stopper layer 4. In this case, if $Ar/O_2$ is used as etching gas of polymer constituting the second interlevel insulating film 3, the selectivity of polymer relative to etching stopper layer 4 can be made approximately indefinite. Etching conditions in this case are shown in Table 5.

TABLE 5

Etching Condition when Polymer is Used as Interlevel Insulating Film

| Item | Data |
|---|---|
| Gas Type | $Ar/O_2$ |
| Gas Flow Rate | 20/20 sccm |
| Pressure | 2 mTorr |
| RF Power | 0.5 KW |
| Substrate Temperature | 0° C. |

Opening 8 is next formed at etching stopper layer 4. The width W2 of opening 8 is defined to be larger than the width W1 of lower-level interconnect line 2.

The sufficient distance between through hole 9 and etching stopper layer 4 can accordingly be ensured. Even if opening 8 is displaced, etching stopper layer 4 is not formed in a region where through hole 9 is to be formed. In the etching step for forming through hole 9, it is possible to avoid the problems that the through hole cannot be formed into a prescribed shape due to the presence of etching stopper layer 4 leading to reduction of the plane area of through hole 9, that the contact area with lower-level interconnect line 2 decreases, or that through hole 9 is not formed.

Even if opening 8 is displaced to some extent, the sufficiently large width W2 of opening 8 can provide an enough distance between through hole 9 and etching stopper layer 4. Accordingly, the margin of position are accuracy when opening 8 is generated increases compared with the conventional device.

However, if the width W2 of opening 8 is too large, etching stopper layer 4 for interconnect lines 7b–7d (see FIG. 2) adjacent thereto cannot be provided. Therefore, the width W2 of opening 8 should be a certain dimension or less. For example, it is required that the width W2 of opening 8 does not exceed the value derived from the formula (distance between interconnect lines 7a–7d)+(line width of interconnect lines 7a–7d)–2×(margin). The range of the width W2 of opening 8 required for obtaining a necessary contact area is shown in Table 6 as an example based on the concept above.

TABLE 6

Opening Size for Interconnect Line Width, Interconnect Line Pitch and Margin

| Line Width | Pitch | Margin Size of Opening (Connection Hole Pattern)(μm) | | | |
|---|---|---|---|---|---|
| (μm) | (μm) | 0.05 μm | 0.1 μm | 0.15 μm | 0.2 μm |
| 1 | 2 | 1.01~2.9 | 1.03~2.8 | 1.05~2.7 | 1.07~2.6 |
| 0.8 | 1.6 | 0.81~2.3 | 0.83~2.2 | 0.85~2.1 | 0.88~2 |
| 0.6 | 1.2 | 0.61~1.7 | 0.63~1.6 | 0.66~1.5 | 0.69~1.4 |
| 0.4 | 0.8 | 0.41~1.1 | 0.44~1 | 0.47~0.9 | 0.5~0.8 |
| 0.3 | 0.6 | 0.32~0.8 | 0.34~0.7 | 0.38~0.6 | 0.41~0.5 |
| 0.2 | 0.4 | 0.22~0.5 | 0.25~0.4 | 0.29~0.3 | |

Figure 4:
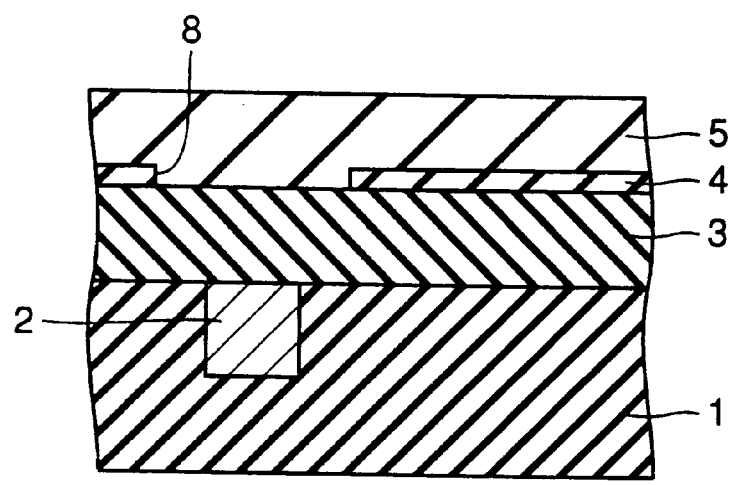

Referring next to FIG. 4, the third interlevel insulating film 5 is formed on etching stopper layer 4 and on opening 8. The film thickness of the third interlevel insulating film 5 corresponds to the height of interconnect lines 7a–7d which is approximately 0.3–2.0 μm.

Figure 5:
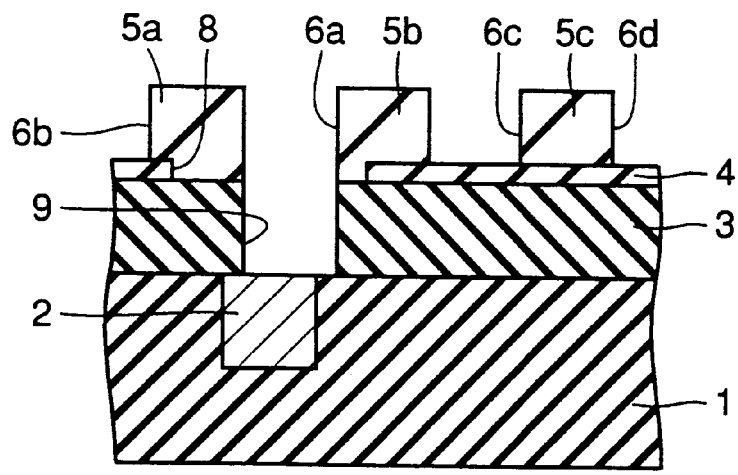

A resist pattern (not shown) is formed on the third interlevel insulating film 5. Using the resist pattern as a mask, the third and second interlevel insulating films 5 and 3 are partially removed to generate trenches 6a–6d and through hole 9 as shown in FIG. 5. In the region where opening 8 is formed at etching stopper layer 4, etching proceeds into the second interlevel insulating film 3 and accordingly through hole 9 is formed. At the bottom of through hole 9, the surface of lower-level interconnect line 2 is exposed. In this etching step, etching of etching stopper layer 4 continues at the bottom of trenches 6b–6d while through hole 9 is generated. In order to avoid removal of etching stopper layer 4 at the bottom of trenches 6a–6d, selectivity of the second and third interlevel insulating films 3 and 5 relative to etching stopper layer 4 should be made higher.

The width of trenches 6a–6d varies depending on the use of the interconnect line. In a semiconductor device having a multilevel interconnect structure, each level has interconnect lines having a width different from an interconnect line width of another level, or interconnect lines within the same level have different widths. When a manufacturing process of a semiconductor device is designed, the minimum interconnect line width is taken into consideration for interconnect lines formed within the same level. The minimum line width is approximately 0.18–1 μm. The aspect ratio of trenches for generating such interconnect lines is about 1–2. Following description is given for the case in which the width of interconnect lines 7a–7d is about 0.18–1 μm as shown above.

Figure 6:
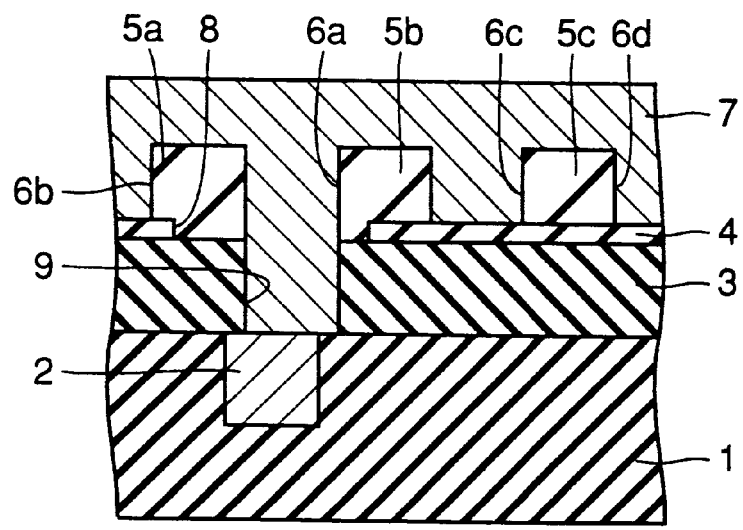

Referring to FIG. 6, conductor film 7 which is an interconnect material is formed within trenches 6a–6d and through hole 9. TiN, WN, TaN or the like is first formed as a bairier metal layer (not shown) in trenches 6a–6d and through hole 9. A copper film is next formed as an interconnect material on the barrier metal layer.

In order to generate the barrier metal layer, PVD (Physical Vapor Deposition) and CVD (Chemical Vapor Deposition) can be employed. As the PVD process, collimation sputtering having a directional enhancement of particles incident on the substrate, long throw sputtering, IMP (Ionized Metal Plasma, disclosed in, for example, Peijun Ding et al., "VMIC Conference" pp. 87–92 (1997)), or the like may be employed instead of the general sputtering. In order to generate the copper film, PVD, CVD and plating can be employed. When the PVD process is employed, it is difficult to generate a copper film without any void generated within the trench since the coverage of the film generated by PVD is not good. The copper can fill the trench having the aspect ratio of approximately 1.5 by raising the substrate temperature when the copper film is formed, applying a high temperature reflow of copper after the copper film is formed, or combining these methods and sputtering with the directional enhancement.

The CVD and plating provide an excellent fill-in characteristic.

The film generating conditions for each material when the sputtering is employed are shown in Table 7.

TABLE 7

Film Generating Condition by Sputtering for Each Material

| Material | Type | Gas | Substrate Temperature | Pressure | Power |
|---|---|---|---|---|---|
| TiN | Long Throw | Ar/N$_2$ | Room Temperature ~ 300° C. | 1~4 mTorr | 5~10 kW |
| WN | Long Throw | Ar/N$_2$ | Room Temperature ~ 300° C. | 1~4 mTorr | 5~10 kW |
| TaN | Long Throw | Ar/N$_2$ | Room Temperature ~ 300° C. | 1~4 mTorr | 5~10 kW |
| CrN | Long Throw | Ar/N$_2$ | Room Temperature ~ 300° C. | 1~4 mTorr | 5~10 kW |
| MoN | Long Throw | Ar/N$_2$ | Room Temperature ~ 300° C. | 1~4 mTorr | 5~10 kW |
| TiWN | Long Throw | Ar/N$_2$ | Room Temperature ~ 300° C. | 1~4 mTorr | 5~10 kW |
| Ta | Long Throw | Ar | Room Temperature ~ 300° C. | 1~4 mTorr | 5~10 kW |
| Cu | Normal | Ar | Room Temperature ~ 400° C. | 2~10 mTorr | 5~15 kW |
| | Long Throw | Ar | Room Temperature ~ 100° C. | 1~4 mTorr | 5~10 kW |
| | Reflow | Ar, H$_2$ | 300~500° C. | 1~10 mTorr | None |
| Al | Normal | Ar | Room Temperature ~ 350° C. | 2~10 mTorr | 5~15 kW |
| | Long Throw | Ar | Room Temperature ~ 100° C. | 1~4 mTorr | 5~10 kW |
| | Reflow | | 400~450° C. | Vacuum | None |
| Ag | Normal | Ar | Room Temperature ~ 350° C. | 2~10 mTorr | 5~15 kW |

The film generating conditions for each material when the CVD is employed are shown in Table 8.

TABLE 8

Film Generating Condition by CVD for Each Material

| Material | Type | Raw Material, Gas | Substrate Temperature | Pressure | RF Power |
|---|---|---|---|---|---|
| TiN | Thermal | TDEAT, NH$_3$ | 300~400° C. | 0.1~0.5 Torr | |
| | | TDMAT, NH$_3$ | 350~450° C. | 1~5 Torr | |
| | Plasma | TiCl$_4$, NH$_3$ | 400~500° C. | 2~10 Torr | 250W |
| TaN | Thermal | TBTDET, NH$_3$ | 450~600° C. | 0.5~2 Torr | |
| WN | Plasma | WF$_6$, NH$_3$ | 350~450° C. | 2~10 Torr | 250W |
| Cu | Thermal | Cu(HFA) (TMVS), H$_2$ | 150~300° C. | 5~20 Torr | |

The conditions for generating a copper film using plating are shown in Table 9.

TABLE 9

Copper Film Generating Condition by Plating

| Plating Solution | H$_2$SO$_4$/CuSO$_4$/H$_2$O |
|---|---|
| | H$_2$SO$_4$:100~200 g/L |
| | CuSO$_4$:30~80 g/L |
| | HCl:20~100 mg/L |
| Current Density | 1~20mA/cm$^2$ |
| Temperature | 30° C. |
| Seed Layer | Sputtering Cu20~100n |

Required characteristics for the barrier metal layer are an excellent adhesive property and an anti-diffusion ability. As the materials that satisfy such requirements, refractory metal such as Cr, Ta, and W, nitride of refractory metal such as CrN and MoN, nitride of refractory metal and silicon such as TiSiN, WSiN and TaSiN, alloy formed of at least two kinds of refractory metals such as TiW, and nitride of alloy formed of at least two kinds of refractory metals such as TiWN may be used, other than the materials mentioned above.

As materials for interconnect lines 7a–7d, alloy of Cu, Ag, Au, and Al having a low electrical resistance (AlCu, AlSiCu or the like), doped polysilicon having an excellent heat resistance, refractory metal such as W, WN, TiN, TiWN and TaN, or a compound thereof may be employed. If the refractory metal or its compound is used, the number of manufacturing steps can be reduced by generating interconnect lines 7a–7d using the same material as that of the barrier metal layer described above.

The portion of conductor film 7 formed on the third interlevel insulating films 5a–5c is removed by CMP. Accordingly, the structure illustrated in FIG. 2 is obtained. As a slurry used for the CMP, mixed solution of QCTT1010 and H202 supplied by Rodel Products Corporation, for example, can be employed. As a pad used for the CMP, a stacked layer pad of IC1000/SUBA400 of the Rodel Products Corporation can be utilized.

A multilevel interconnect structure having more levels can be produced by repeating those processes described above.

The values of via resistance in through hole 9 of the multilevel interconnect structure thus generated are shown in Table 10 with the values of via resistance in a through hole of a multilevel interconnect structure of the conventional semiconductor device.

TABLE 10

Via Resistance of Semiconductor Device Interconnect Line According to Conventional Example and This Embodiment of the Invention

| | Via Resistance | |
|---|---|---|
| Diameter of Through Hole | Conventional Device | This Embodiment |
| 1 μm | 0.05 Ω | 0.05 Ω |
| 0.8 μm | 0.08 Ω | 0.07 Ω |
| 0.6 μm | 0.2 Ω | 0.14 Ω |
| 0.4 μm | 0.6 Ω | 0.33 Ω |
| 0.3 μm | 2.0 Ω | 0.67 Ω |
| 0.2 μm | open | 1.9 Ω |

Figure 7:
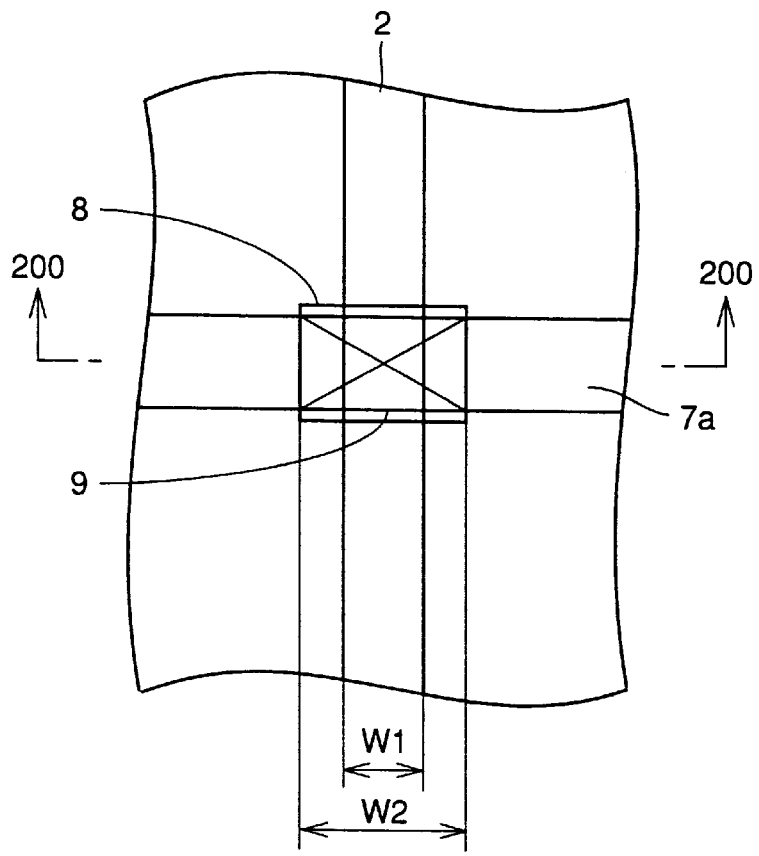
FIG. 7 is a plan view illustrating a first modification of the semiconductor device according to the first embodiment.
Figure 8:
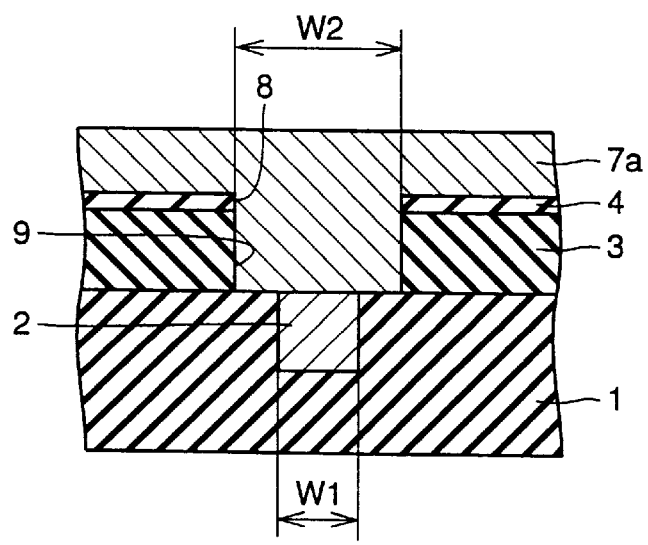
FIG. 8 is a cross section along line 200—200 in FIG. 7.

Referring next to FIG. 7, a first modification of the semiconductor device according to the first embodiment basically has a structure similar to that of the semiconductor device of the first embodiment shown in FIG. 1. A difference between the first modification shown in FIG. 7 and the embodiment shown in FIG. 1 is that an interconnect line 7a is formed to extend in a direction almost vertical to the direction in which a lower-level interconnect line 2 extends in the first modification. The cross section taken along line 200—200 shown in FIG. 7 is illustrated in FIG. 8. Referring to FIG. 8, the first modification of the semiconductor device of the first embodiment basically has a structure similar to that of the semiconductor device of the first embodiment shown in FIG. 2 except that the width of a through hole 9 is almost equal to a width W2 of an opening 8 of an etching stopper layer 4. The reason is that opening 8 of etching stopper layer 4 is used as an etching mask in the etching process for generating through hole 9 in the manufacturing process of the first modification. By utilizing opening 8 as an etching mask for generating through hole 9 by etching, through hole 9 having a sufficient plane area can easily be formed.

It is noted that according to the semiconductor device of the first embodiment shown in FIGS. 1 and 2, opening 8 is also utilized as an etching mask for generating through hole 9 by etching and accordingly a similar effect is achieved.

Figure 9:
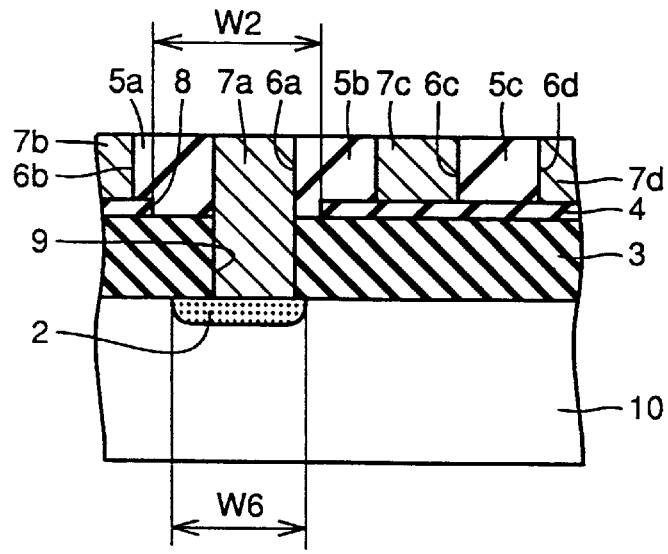
FIG. 9 is a cross section illustrating a second modification of the semiconductor device according to the first embodiment.

Referring to FIG. 9, a second modification of the semiconductor device according to the first embodiment basically has a structure similar to that of the semiconductor device of the first embodiment shown in FIG. 2, except that a through hole 9 is formed on an impurity region 11 corresponding to a conductive region formed at a main surface of a semiconductor substrate 10 in the second modification shown in FIG. 9. A width W2 of an opening 8 of an etching stopper layer 4 is made larger than a width W6 of impurity region 11. Accordingly, the second modification achieves an effect similar to that of the semiconductor device of the first embodiment shown in FIG. 2.

The first and second modifications of the semiconductor device according to the first embodiment shown in FIGS. 7 to 9 can basically be fabricated through a process similar to the manufacturing process of the semiconductor device according to the first embodiment shown in FIGS. 3 to 6.

Second Embodiment

Figure 10:
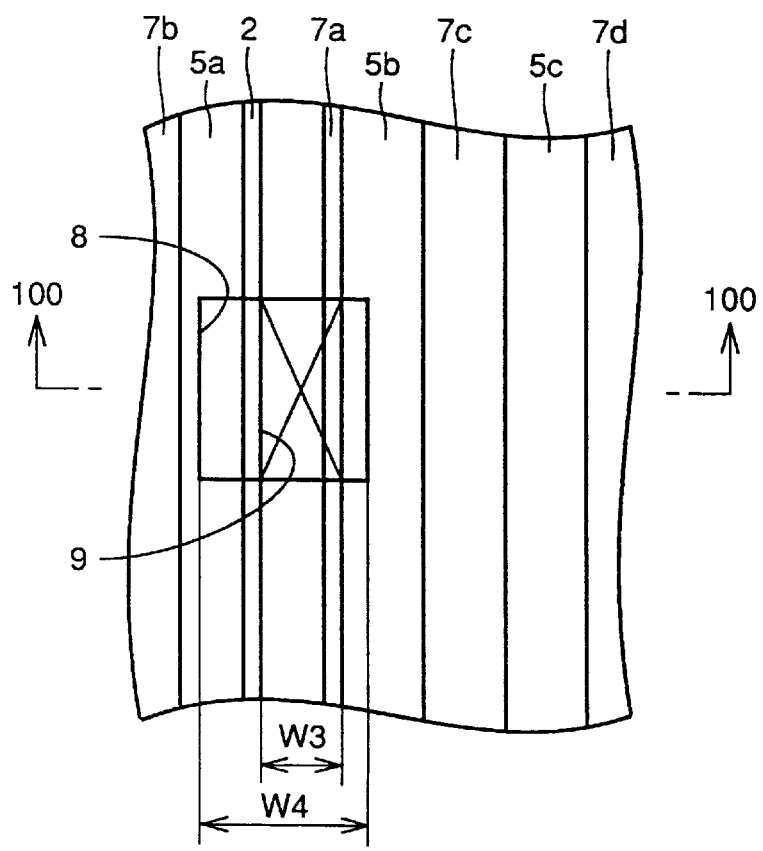
FIG. 10 is a plan view of a semiconductor device according to a second embodiment of the invention.
Figure 11:
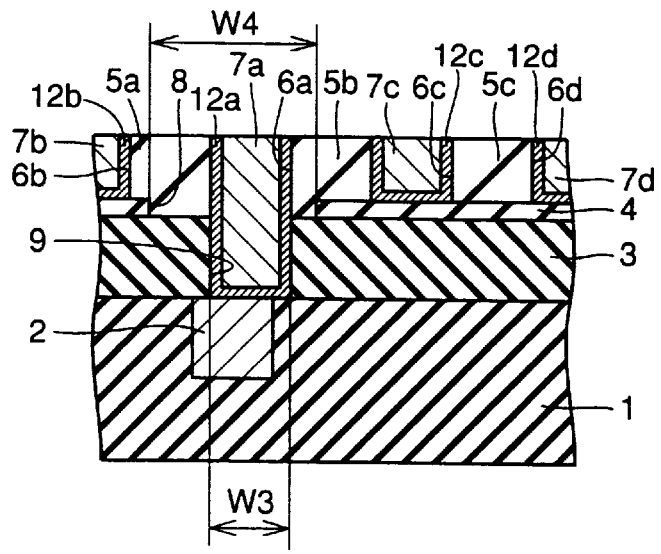
FIG. 11 is a cross section along line 100—100 in FIG. 10.

Referring to FIGS. 10 and 11, a semiconductor device according to the second embodiment basically has a structure similar to that of the semiconductor device of the first embodiment shown in FIGS. 1 and 2, except that a width W4 of an opening 8 of an etching stopper layer 4 is larger than the width of a lower-level interconnect line 2 and larger than a width W3 of an interconnect line 7a in the semiconductor device of the second embodiment shown in FIGS. 10 and 11.

Accordingly, if a trench 6a for generating interconnect line 7a and a through hole 9 are successively formed in the same etching process, the width of trench 6a is almost equal to the width of through hole 9. The width W4 of opening 8 is thus larger than the width of through hole 9. Therefore, the distance between a sidewall of through hole 9 and a sidewall of opening 8 of etching stopper layer 4 can be made sufficiently large. Even if opening 8 is displaced, etching stopper layer 4 is not generated in a region where through hole 9 should be formed. Due to the presence of etching stopper layer 4 in the etching process for generating through hole 9, through hole 9 might not be formed into a prescribed shape leading to a reduced plane area of through hole 9 or through hole 9 could not be formed. However, such problems can be prevented in this embodiment. Through hole 9 having a sufficient plane area can surely be formed. A highly reliable semiconductor device can be obtained accordingly.

Further, since the width W4 of opening 8 is larger than the width W3 of interconnect line 7a, when opening 8 is formed as done in the first embodiment, the margin of position accuracy can be increased compared with the conventional device. A semiconductor device having through hole 9 with a sufficient dimension can be obtained more easily.

As described regarding the semiconductor device of the first embodiment above, barrier metal layers 12a–12d are respectively formed at surfaces of interconnect lines 7a–7d. The method and material for generating barrier metal layers 12a–12d are similar to those for the barrier metal layers of the first embodiment.

Figure 12:
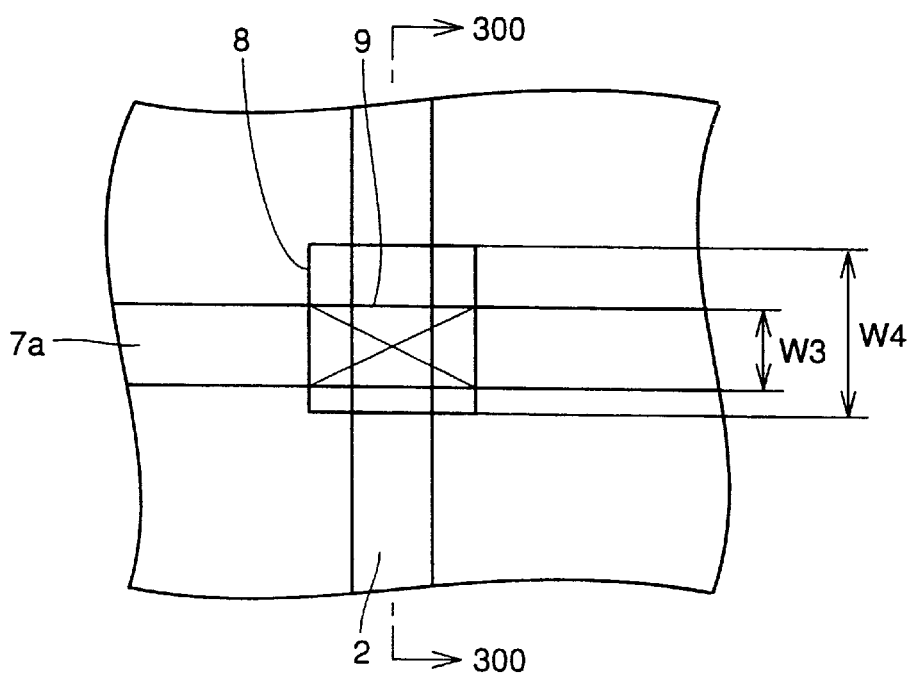
FIG. 12 is a plan view illustrating a modification of the semiconductor device according to the second embodiment.
Figure 13:
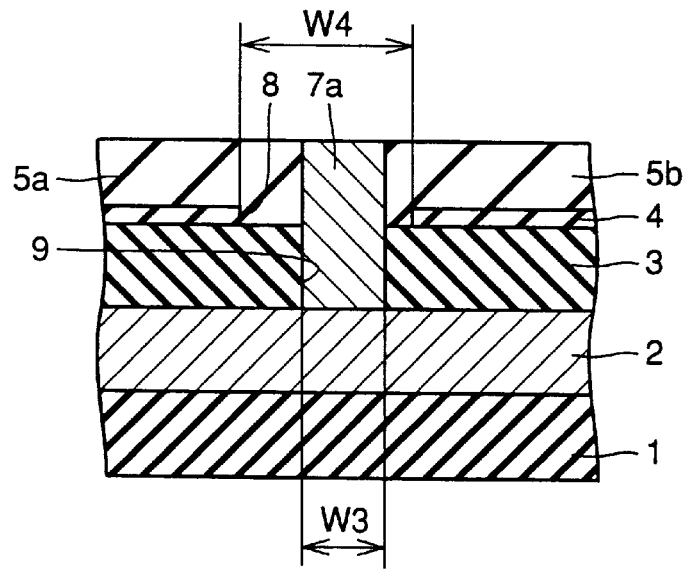
FIG. 13 is a cross section along line 300—300 in FIG. 12.

Referring to FIGS. 12 and 13, a modification of the semiconductor device of the second embodiment basically has a structure similar to that of the semiconductor device of the second embodiment shown in FIGS. 10 and 11. In the modification of the semiconductor device of the second embodiment shown in FIGS. 12 and 13, an interconnect line 7a is formed to extend in a direction almost perpendicular to a lower-level interconnect line 2. Owing to the width W4 of an opening 8 made larger than the width W3 of interconnect line 7a, an effect similar to that of the second embodiment shown in FIGS. 10 and 11 is achieved.

Third Embodiment

Figure 14:
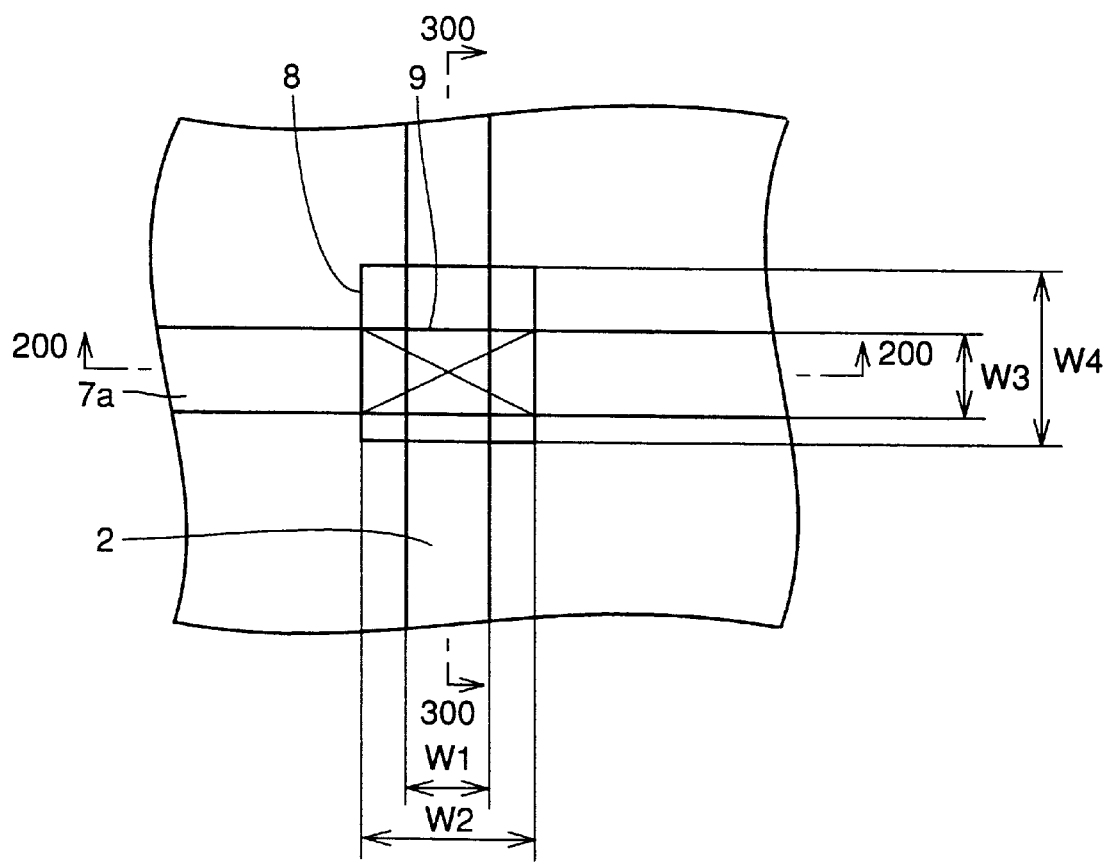
FIG. 14 is a plan view of a semiconductor device according to a third embodiment.

Referring to FIG. 14, a semiconductor device according to the third embodiment of the invention basically has a structure similar to that of the first modification of the semiconductor device of the first embodiment shown in FIG. 7. According to the semiconductor device of the third embodiment, a width W2 of an opening 8 at an etching stopper layer (not shown) in a direction almost perpendicular to a direction in which a lower-level interconnect line 2 extends is made larger than a width W1 of lower-level interconnect line 2, and a width W4 of opening 8 in a direction almost perpendicular to a direction in which interconnect line 7a extends is made larger than a width W3 of interconnect line 7a. Therefore, according to the third embodiment of the invention, the semiconductor device achieves both of the effects obtained by the first embodiment and the effect obtained by the second embodiment.

A cross section along line 200—200 in FIG. 14 is substantially the same as the cross section of the first modification of the semiconductor device according to the first embodiment shown in FIG. 8. A cross section along line 300—300 in FIG. 14 is substantially the same as the cross section of the modification of the semiconductor device according to the second embodiment shown in FIG. 13.

The semiconductor device of the third embodiment can be fabricated by a manufacturing process almost similar to that of the semiconductor device of the first embodiment.

Fourth Embodiment

Figure 15:
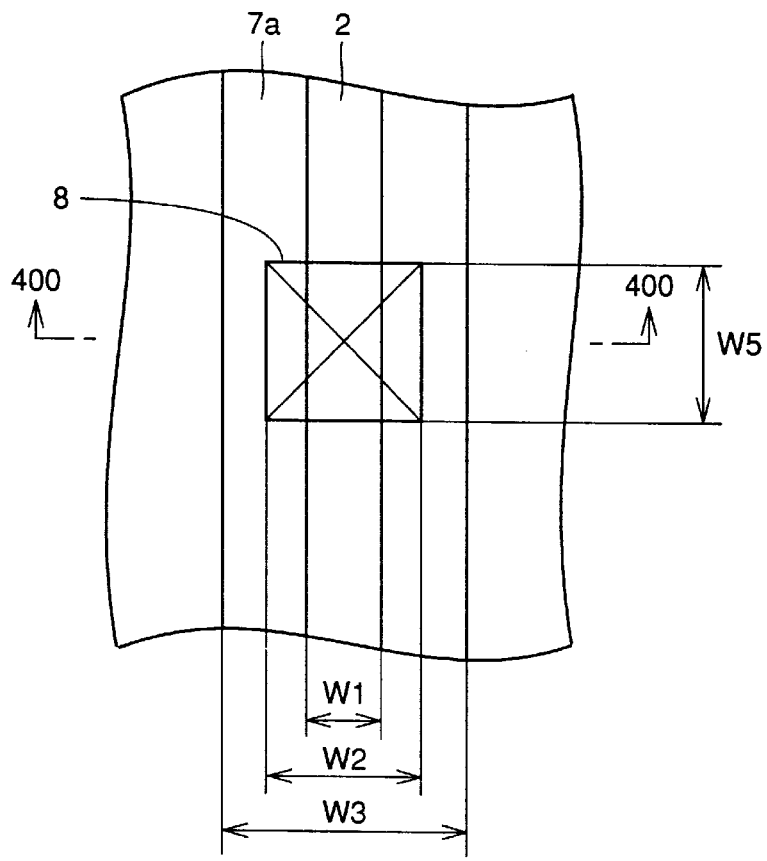
FIG. 15 is a plan view of a semiconductor device according to a fourth embodiment.
Figure 16:
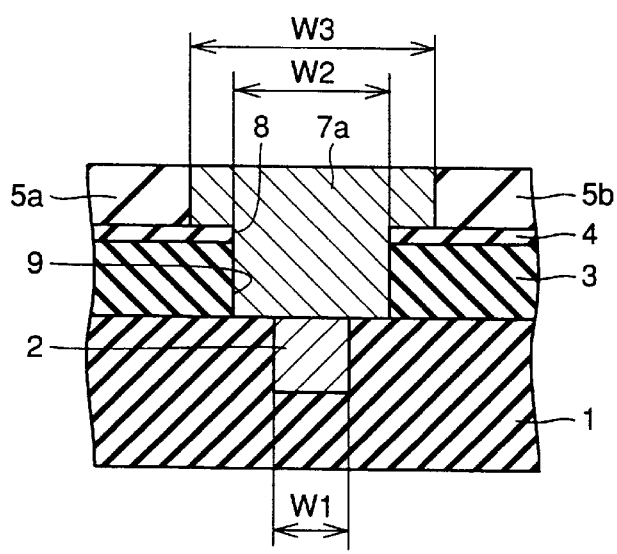
FIG. 16 is a cross section along line 400—400 in FIG. 15.

Referring to FIGS. 15 and 16, a semiconductor device of the fourth embodiment basically has a structure similar to that of the first embodiment shown in FIG. 1. According to the fourth embodiment, a width W3 of an interconnect line 7a is larger than a width W2 of an opening 8 in a direction almost perpendicular to the direction in which interconnect line 7a extends, and the widths W2 and W5 in directions respectively almost perpendicular to and almost parallel to the direction in which interconnect line 7a extends are made substantially equal to each other. Accordingly, the two-dimensional shape of opening 8 is almost square.

In the semiconductor device according to the fourth embodiment, interconnect line 7a can be formed to entirely cover opening 8. When the dual damascene process is used in the manufacturing process of the semiconductor device, an etching stopper layer 4 (see FIG. 16) can be utilized as an etching mask in the etching process for generating a through hole 9 (see FIG. 16). It is accordingly possible to provide through hole 9 with a two-dimensional shape which is substantially the same as the two-dimensional shape of opening 8. Through hole 9 having the width W2 larger than the width W1 of a lower-level interconnect line 2 can be formed. Through hole 9 having a sufficient plane area can thus be formed easily to achieve a highly reliable semiconductor device.

Opening 8 shaped into an almost square can be used as an etching mask to generate through hole 9, so that the etching can be controlled more precisely compared with the conventional etching process that generates a rectangular two-dimensional shape of through hole 9.

Further, the two-dimensional shape of through hole 9 is formed into a square which is substantially the same as the two-dimensional shape of opening 8. Therefore, it is possible to prevent generation of through hole 9 having its rectangular two-dimensional shape with various sizes due to displacement of opening 8 in the conventional manufacturing process of the semiconductor device. The etching process for generating through hole 9 can be controlled more easily. Through hole 9 having a sufficiently large plane area can thus be formed easily.

Figure 17:
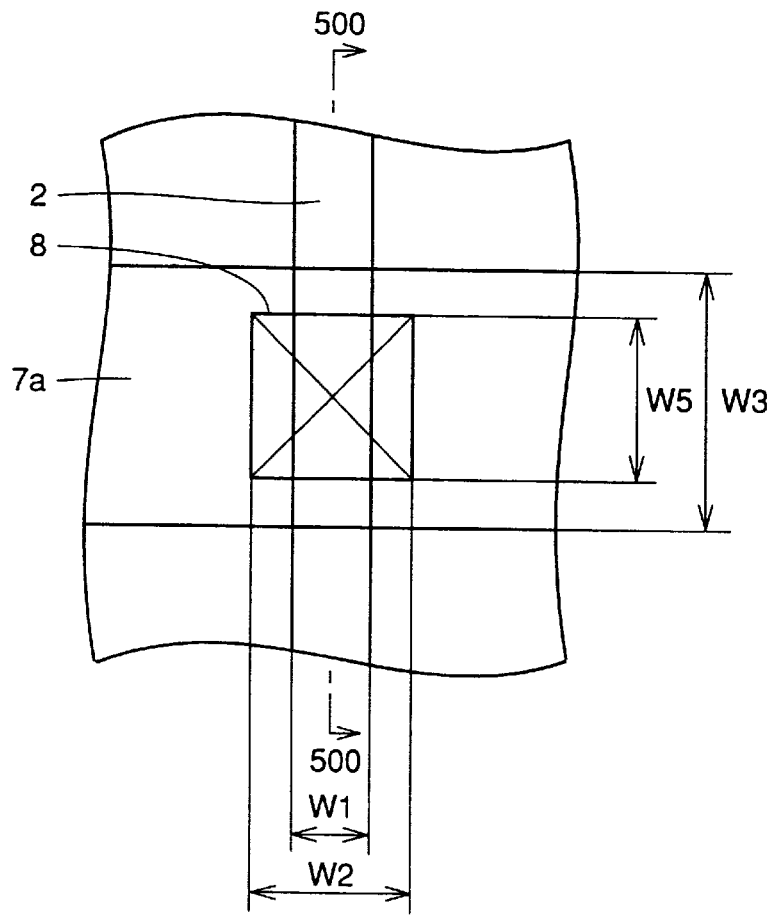
FIG. 17 is a plan view illustrating a modification of the semiconductor device according to the fourth embodiment.
Figure 18:
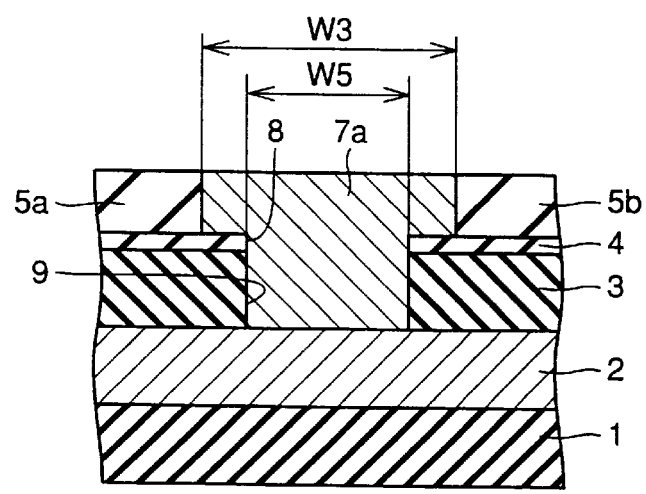
FIG. 18 is a cross section along line 500—500 in FIG. 17.

Referring to FIGS. 17 and 18, a modification of the semiconductor device of the fourth embodiment basically has a structure similar to that of the semiconductor device of the fourth embodiment shown in FIGS. 15 and 16. According to this modification, an interconnect line 7a is generated to extend in a direction almost perpendicular to the direction in which a lower-level interconnect line 2 extends. Similarly to the semiconductor device of the fourth embodiment, a width W3 of interconnect line 7a is made larger than a width W5 of an opening 8 in a direction almost perpendicular to the direction in which interconnect line 7a extends. Therefore, an effect similar to that of the semiconductor device of the fourth embodiment shown in FIGS. 15 and 16 is achieved.

Fifth Embodiment

Figure 19:
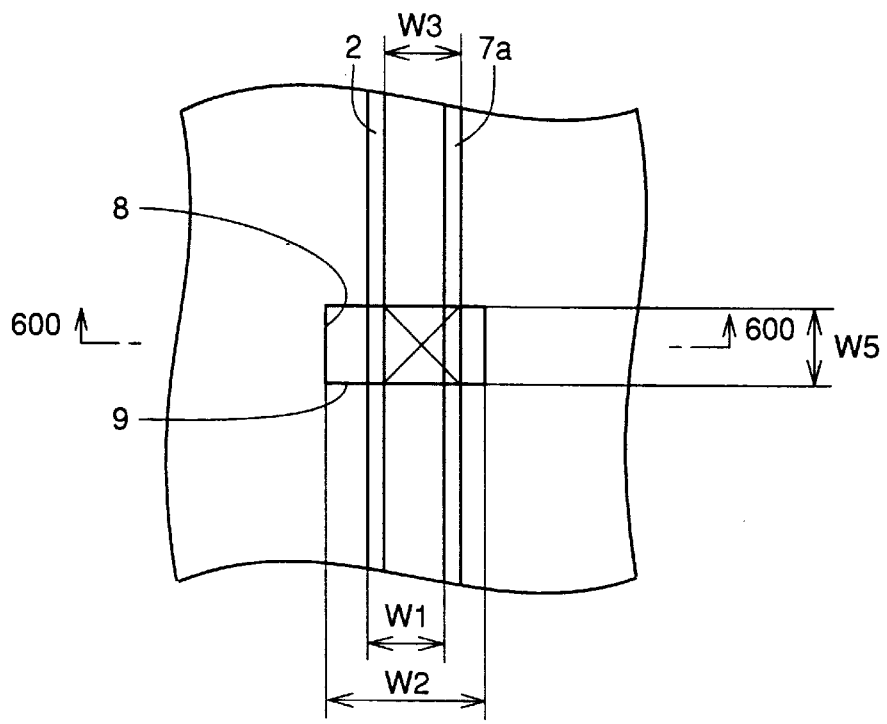
FIG. 19 is a plan view of a semiconductor device according to a fifth embodiment.

Referring to FIG. 19, a semiconductor device according to the fifth embodiment basically has a structure similar to that of the first embodiment shown in FIG. 1. A cross section taken along line 600—600 in FIG. 19 is basically similar to the cross section of the semiconductor device of the first embodiment shown in FIG. 2. In the semiconductor device according to the fifth embodiment, a width W2 of an opening 8 in a direction almost perpendicular to the direction in which an interconnect line 7a extends is made larger than a width W3 of interconnect line 7a, and red a width W5 of opening 8 in a direction almost parallel to the direction in which interconnect line 7a extends is made substantially equal to the width W3 of interconnect line 7a. Consequently, the two-dimensional shape of a through hole 9 is almost square.

When an etching stopper layer (not shown) is utilized as an etching mask in the etching process for generating through hole 9, the two-dimensional shape of through hole 9 can be made almost square as shown in FIG. 19. Therefore, the etching for generating through hole 9 can be controlled more precisely compared with the conventional device in which through hole 9 is rectangular.

Figure 20:
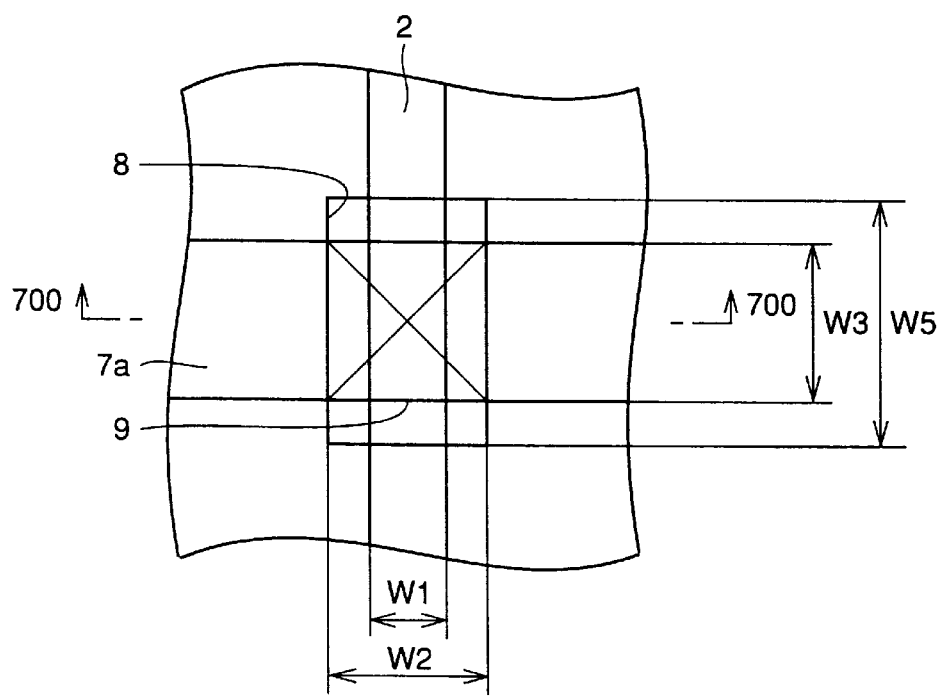
FIG. 20 is a plan view illustrating a modification of the semiconductor device according to the fifth embodiment.
Figure 21:
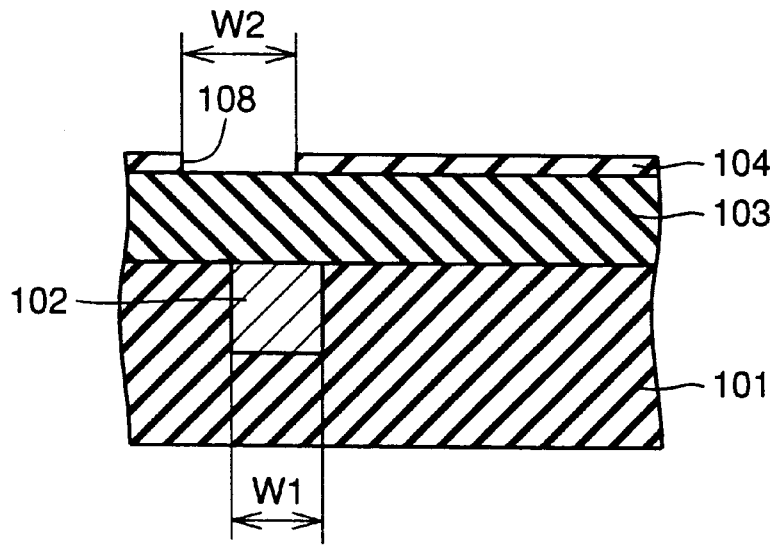
FIGS. 21–25 are cross sections respectively illustrating the first to the fifth steps of a manufacturing process of a conventional semiconductor device.
Figure 22:
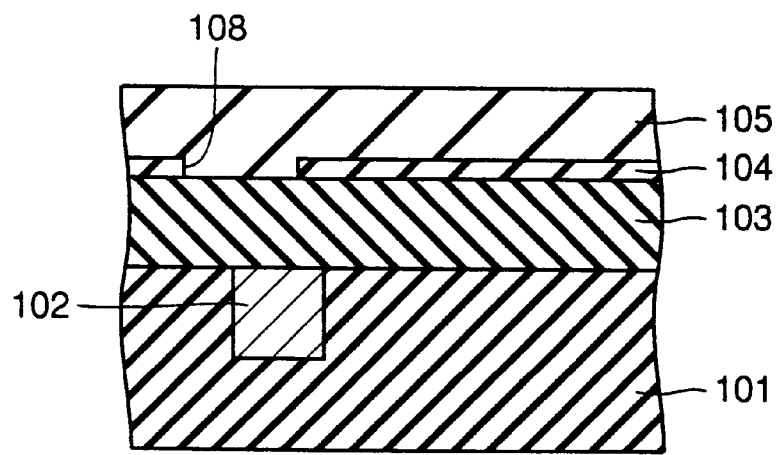
Figure 23:
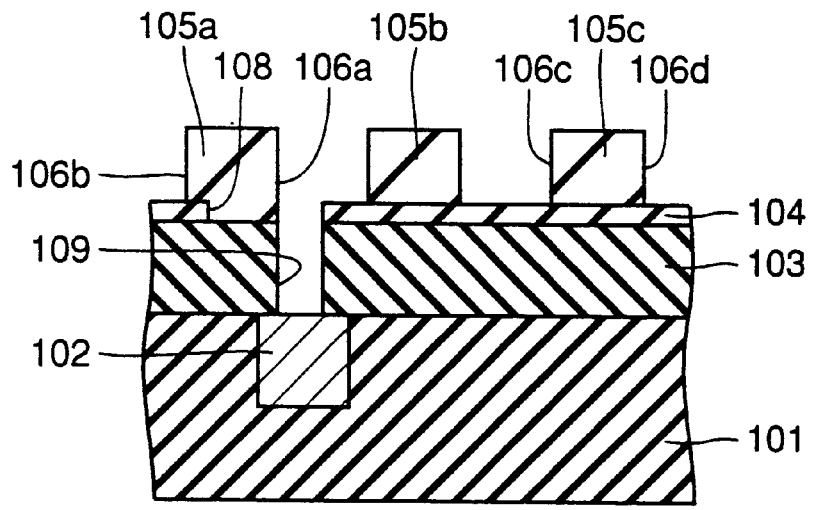
Figure 24:
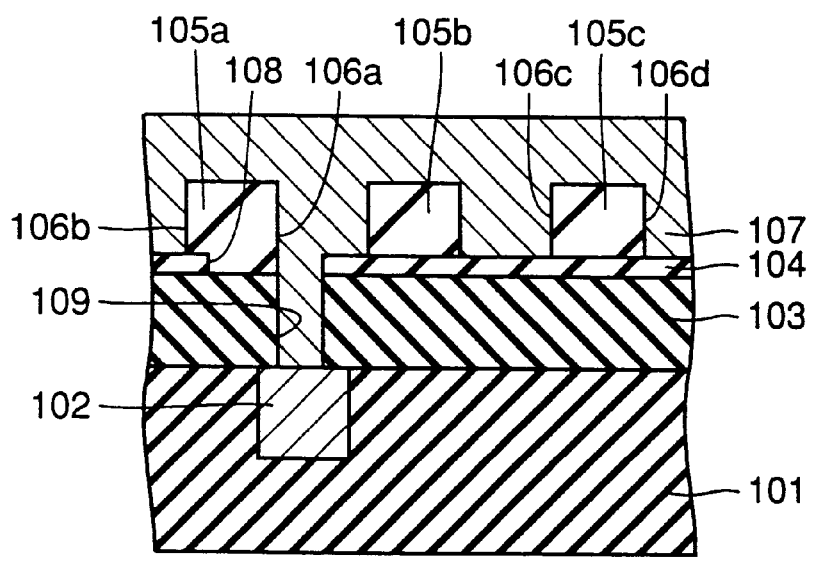
Figure 25:
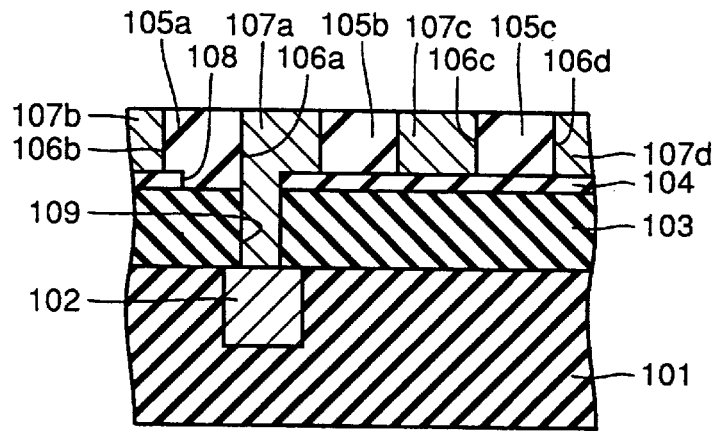
Figure 26:
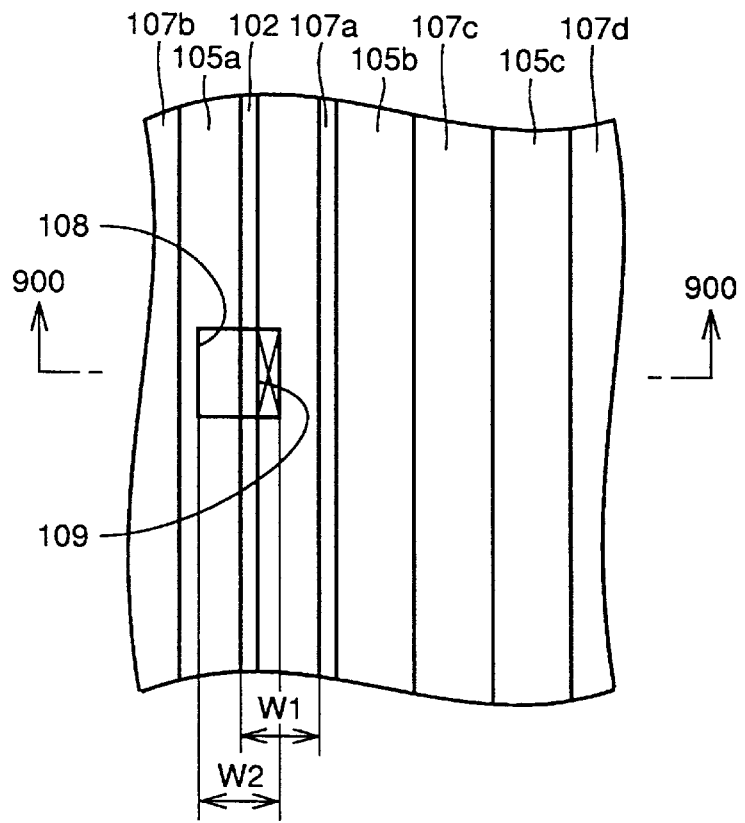
FIG. 26 is a plan view of the conventional semiconductor device.
Figure 27:
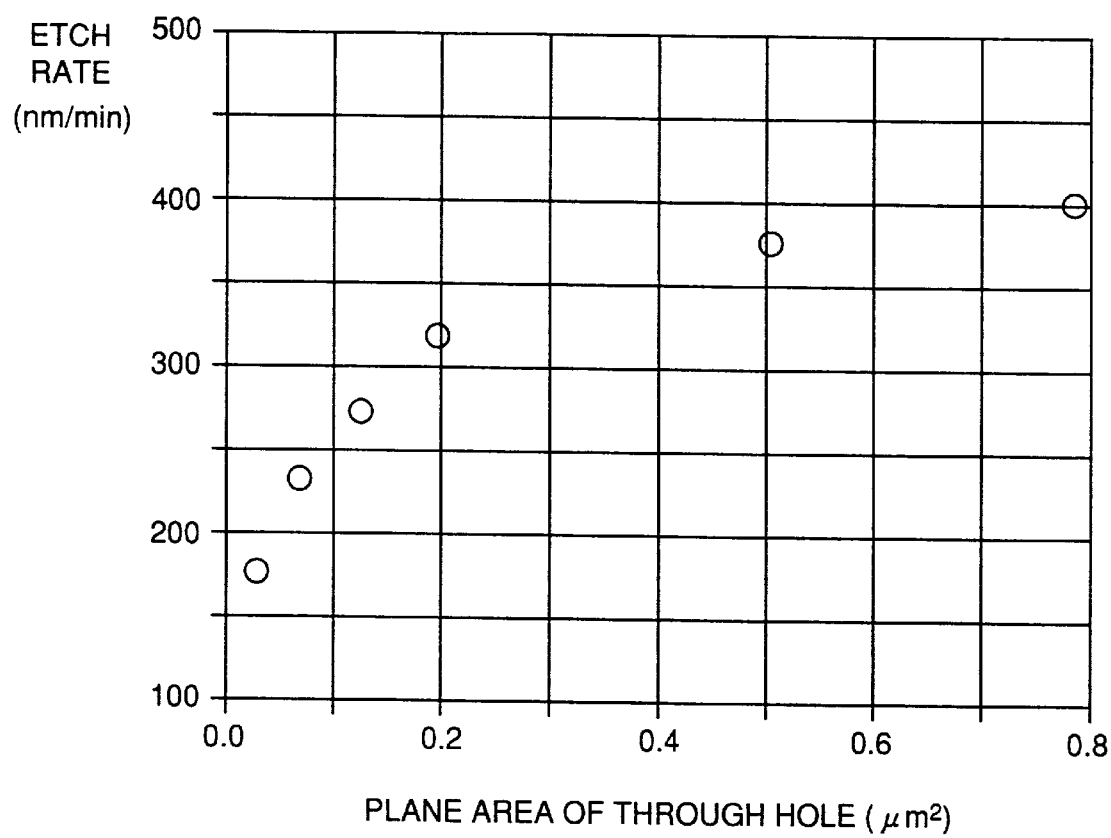
FIG. 27 is a graph showing a relation between a plane area and an etch rate of a through hole of a semiconductor device.

Referring to FIG. 20, a modification of the fifth embodiment basically has a structure similar to that of the semiconductor device shown in FIG. 19. Further, a cross section along line 700—700 in FIG. 20 is basically the same as the cross section of the first modification of the semiconductor device of the first embodiment shown in FIG. 8. According to this modification, an interconnect line 7a is formed to extend in a direction almost perpendicular to the direction in which a lower-level interconnect line 2 extends. In the modification of the semiconductor device of the fifth embodiment, a width W5 of an opening 8 in a direction almost perpendicular to the direction in which interconnect line 7a extends is defined to be larger than a width W3 of interconnect line 7a, and a width W2 of opening 8 in a direction almost parallel to the direction in which interconnect line 7a extends is defined to be almost equal to the width W3 of interconnect line 7a. Accordingly, through hole 9 has its two-dimensional shape which is almost square. In this case, an effect similar to that of the semiconductor device of the fifth embodiment shown in FIG. 19 is achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
 a conductive region having a first width;
 an interlevel insulating film formed on said conductive region and having a through hole formed to expose said conductive region;
 a coating film formed on said interlevel insulating film and having an opening generated in a region located on said through hole, the opening having a second width larger than said first width;
 an interconnect layer formed in a region located on said opening; and
 a conductor film formed within said through hole for electrically connecting said conductive region and said interconnect layer.

2. The semiconductor device according to claim 1, wherein said conductive region is a lower-level interconnect layer.

3. The semiconductor device according to claim 1, wherein said conductive region is formed at a main surface of a semiconductor substrate.

4. The semiconductor device according to claim 1, wherein said interconnect layer is buried in an insulating film formed on said coating film, and an upper surface of said insulating film and an upper surface of said interconnect layer are located on substantially the same plane.

5. The semiconductor device according to claim 1, wherein a width of said opening in a direction almost perpendicular to a direction in which said interconnect layer extends is larger than a width of said interconnect layer.

6. The semiconductor device according to claim 1, wherein a width of said interconnect layer is larger than a width of said opening in a direction almost perpendicular to a direction in which said interconnect layer extends.

7. The semiconductor device according to claim 1, wherein a width of said interconnect layer is almost equal to a width of said opening in a direction almost parallel to a direction in which said interconnect layer extends.

8. The semiconductor device according to claim 1, wherein a barrier metal layer is formed at a surface of said interconnect layer.

9. The semiconductor device according to claim 1, wherein said interconnect layer and said conductor film include at least one selected from the group consisting of Cu, Cu alloy, Al, Al alloy, Ag, Ag alloy, Au, W, WN, TiN, TiWN, Ta, TaN and doped polysilicon.

10. The semiconductor device according to claim 1, wherein said coating film includes at least one selected from the group consisting of SiN, SiON, SiN containing fluorine, SiON containing fluorine, $Al_2O_3$, and $Al_2O_3$ containing fluorine.

11. The semiconductor device according to claim 1, wherein said through hole in said interlevel insulating film and said opening in the region located on said through hole have a similar two-dimensional shape, and said opening and said interconnect layer overlap.

12. The semiconductor device according to claim 4, wherein a width of said opening in a direction almost perpendicular to a direction in which said interconnect layer extends is larger than a width of said interconnect layer.

13. The semiconductor device according to claim 4, wherein a width of said interconnect layer is larger than a width of said opening in a direction almost perpendicular to a direction in which said interconnect layer extends.

14. The semiconductor device according to claim 4, wherein a barrier metal layer is formed at a surface of said interconnect layer.

15. The semiconductor device according to claim 6, wherein a two-dimensional shape of said opening is substantially square.

16. The semiconductor device according to claim 8, wherein said barrier metal layer includes at least one selected from the group consisting of refractory metal, nitride of refractory metal, nitride of refractory metal and silicon, alloy containing at least two kinds of refractory metals, and nitride of alloy containing at least two kinds of refractory metals.

* * * * *